United States Patent
Liu et al.

(10) Patent No.: US 8,466,982 B2
(45) Date of Patent: Jun. 18, 2013

(54) LOW COMMON MODE DRIVER

(75) Inventors: Min Liu, Milpitas, CA (US); Xin Wang, Foothill Ranch, CA (US); Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 261 days.

(21) Appl. No.: 13/154,302

(22) Filed: Jun. 6, 2011

(65) Prior Publication Data

US 2012/0307122 A1    Dec. 6, 2012

(51) Int. Cl.
*H04N 5/228* (2006.01)
*H03B 1/00* (2006.01)
*H03K 3/00* (2006.01)

(52) U.S. Cl.
USPC ........................................ 348/222.1; 327/108

(58) Field of Classification Search
None
See application file for complete search history.

(56) References Cited

U.S. PATENT DOCUMENTS

| | | | | |
|---|---|---|---|---|
| 6,380,797 | B1 * | 4/2002 | Macaluso et al. | 327/513 |
| 6,720,805 | B1 * | 4/2004 | Haas | 327/108 |
| 7,619,448 | B2 * | 11/2009 | Wu et al. | 327/108 |
| 7,880,512 | B2 * | 2/2011 | Takeuchi | 327/108 |
| 2007/0279105 | A1 * | 12/2007 | Sunairi | 327/108 |

OTHER PUBLICATIONS

Palmer, R., et al., "24.03 A 14mW 6.25Gb/s Transceiver in 90nm CMOS for Serial Chip-to-Chip Communications, 2007 IEEE International Solid-State Circuits Conference, ISSCC 2007 / Feb. 14, 2007, Digest of Technical Papers", (Feb. 2007), pp. 440-441, 614.

* cited by examiner

*Primary Examiner* — Albert Cutler
(74) *Attorney, Agent, or Firm* — Blakely Sokoloff Taylor & Zafman LLP (57) ABSTRACT

Techniques to provide a replica bias circuit for a high speed and low voltage common mode driver. In an embodiment, a pre-driver is coupled to provide driver input voltages to the driver, which driver includes a set of circuit elements coupled to provide, based on the driver input voltages, an output signal of a differential output. In another embodiment, a regulator circuit is coupled to provide regulated power to the pre-driver and driver, where the regulator circuit includes a scale replica circuit having a replica of the first set of circuit elements.

18 Claims, 6 Drawing Sheets

LOW COMMON MODE DRIVER

BACKGROUND

1. Technical Field

This disclosure relates generally to drivers, and more particularly, but not exclusively, relates to low voltage differential signaling devices.

2. Background Art

Various high speed differential serial link standards have been designed to accommodate increased off-chip data rate communications. High speed Universal Serial Bus (USB), firewire (IEEE-1394), serial Advanced Technology Attachment (ATA) and Small Computer System Interface (SCSI) are a few of the standards used for serial data transmission in the PC industry. Low voltage differential signaling (LVDS) has also been implemented in transmission-side serial data communications.

Additionally, vendors (such as cellular phone companies) have proposed a "subLVDS" standard, which is a smaller voltage-swing variant of the LVDS standard. SubLVDS has been suggested for use in the Compact Camera Port 2 (CCP2) specification for serial communications—e.g. between image sensors and onboard systems.

CCP2 is part of the Standard Mobile Imaging Architecture (SMIA) standard. Typical LVDS/subLVDS levels have an output common mode level (Vcm) between supply voltages VDD and VSS. For example, transmitters (Tx) for CCP2 normally have an output signal swing (Vod) of 150 mV with center voltage Vcm at 0.9V.

In addition to high speed image data, low speed chip control signals are often transmitted between host and client. Several new protocols have been developed for high speed ("HS") to low power ("LP") state changes using common mode levels. A joint effort among various cellular phone companies has defined a new physical layer (PHY) standard. The PHY standard defines the Mobile Industry Processor Interface (MIPI), which combines high speed image data transmission and low speed control signals in a single communication signal path ("lane").

Figure 1:
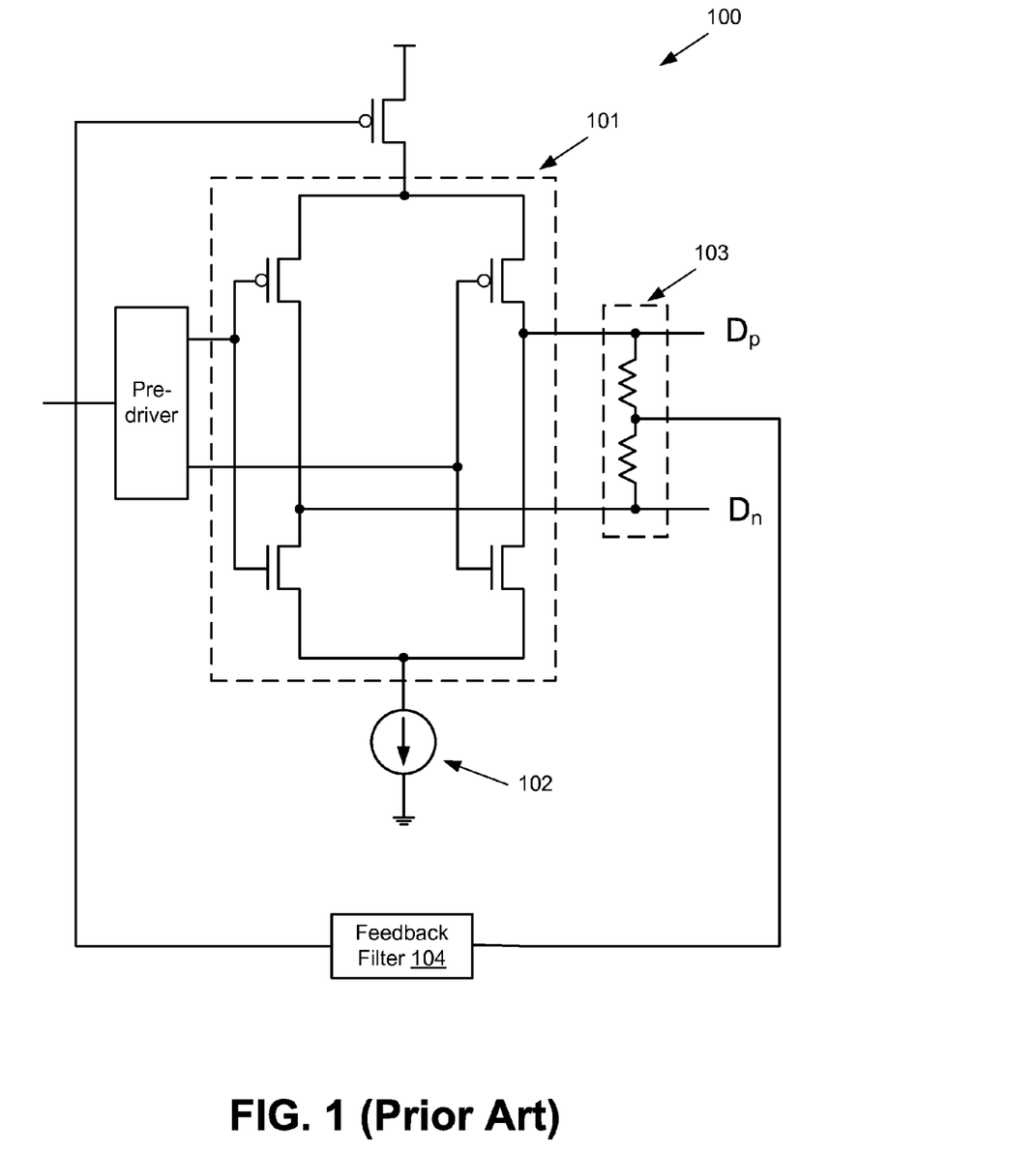
FIG. 1 is a block diagram of a conventional LVDS driver.

FIG. 1 is a block diagram showing a conventional LVDS interface 100. LVDS interface 100 includes a differential current switch pair 101 for a driver (or "output") stage with a current source 102. The tail current from differential current switch pair 101 is adjusted to control the output voltage swing. The common mode level Vcm is sensed by tapping the mid-point of back termination resistor 103. The Vcm is tracked and adjusted using common mode feedback filter 104 in real time.

For high speed transmission, a certain degree of impedance matching has been used for longer transmission lines. A conventional LVDS interface typically includes 100Ω to 200Ω back termination resistor 103 on chip between differential output pads Dp and Dn—e.g. to improve differential reflection coefficients lower than −10 dB at frequencies of typical interest. However, real time Vcm tracking in such a design is not realistic due to the longer common mode settle times required during a mode change from LP to HS mode—e.g. from a logic high voltage of 1.2V in LP mode to logic high voltage of 100 mV in HS mode. Also, a power penalty may result from back termination resistors 103, which could result in a need for an additional 50% to 100% for output driver current. Therefore, low common mode transmission designs exhibit limited responsiveness to LVDS settle times and/or limited efficiencies in silicon space or power consumption.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide a replica bias circuit with which a low common mode driver of a transmitter may perform high speed signal transmissions and low power signal transmissions. For example, one embodiment provides a transmitter which includes power regulation circuitry for the transmitter to variously operate in at least two transmission modes—e.g. where one transmission mode is a relatively lower power and lower speed mode, as compared to the other, relatively higher power and higher speed transmission mode.

In an embodiment, a transmitter includes a pre-driver coupled to receive one or more data signals and to provide driver input voltages based on the one or more data signals. The transmitter may further include a driver (also referred to as an output stage) coupled to the pre-driver—e.g. where the driver is coupled to provide a differential output based on the driver input voltages generated by the pre-driver. For example, the driver may include a set of circuit elements coupled to provide an output signal of a differential output. The set of circuit element may be coupled in series with one another—e.g. between supply voltages VDD and VSS (such as ground). The set of circuit elements may include, for example, circuit elements of a pull-up path for pulling the output signal up to a logic high voltage level. Alternatively of in addition, the set of circuit elements may include circuit elements of a pull-down path for pulling the output signal down to a logic low voltage level.

In certain embodiments, the transmitter may include one or more regulator circuits to provide regulated power to either or both of the pre-driver and the driver of the transmitter. A regulator circuit may include, for example, a scale replica circuit which includes a replica of the set of circuit elements of the driver which are to provide an output signal. The scale replica circuit may be coupled to provide a feedback voltage for power supply regulation.

In one embodiment, a regulator circuit includes a transistor through which the regulator circuit is to provide regulated power to the driver. The regulator may further include an error amplifier to provide an output which, for example, directly or indirectly controls operation of the transistor. The error amplifier may amplify a difference between a reference voltage and the voltage feedback provided by the scale replica circuit. In an embodiment, the transistor and the scale replica circuit share a connection to an output of the error amplifier.

In another embodiment, a regulator circuit is to provide regulated power to the pre-driver—e.g. where the pre-driver is coupled to a supply voltage through a transistor of the regulator circuit. The regulator circuit may include a first amplifier and an error amplifier—e.g. where an output of the error amplifier and an output of the first amplifier are both connected to the transistor. The scale replica circuit of the regulator circuit may be coupled to provide a feedback voltage to the error amplifier—e.g. wherein the error amplifier is to amplify a difference between the feedback voltage and a reference voltage. Moreover, the scale replica circuit may be further coupled to a feedback loop extending from the transistor back to the first amplifier.

Figure 2:
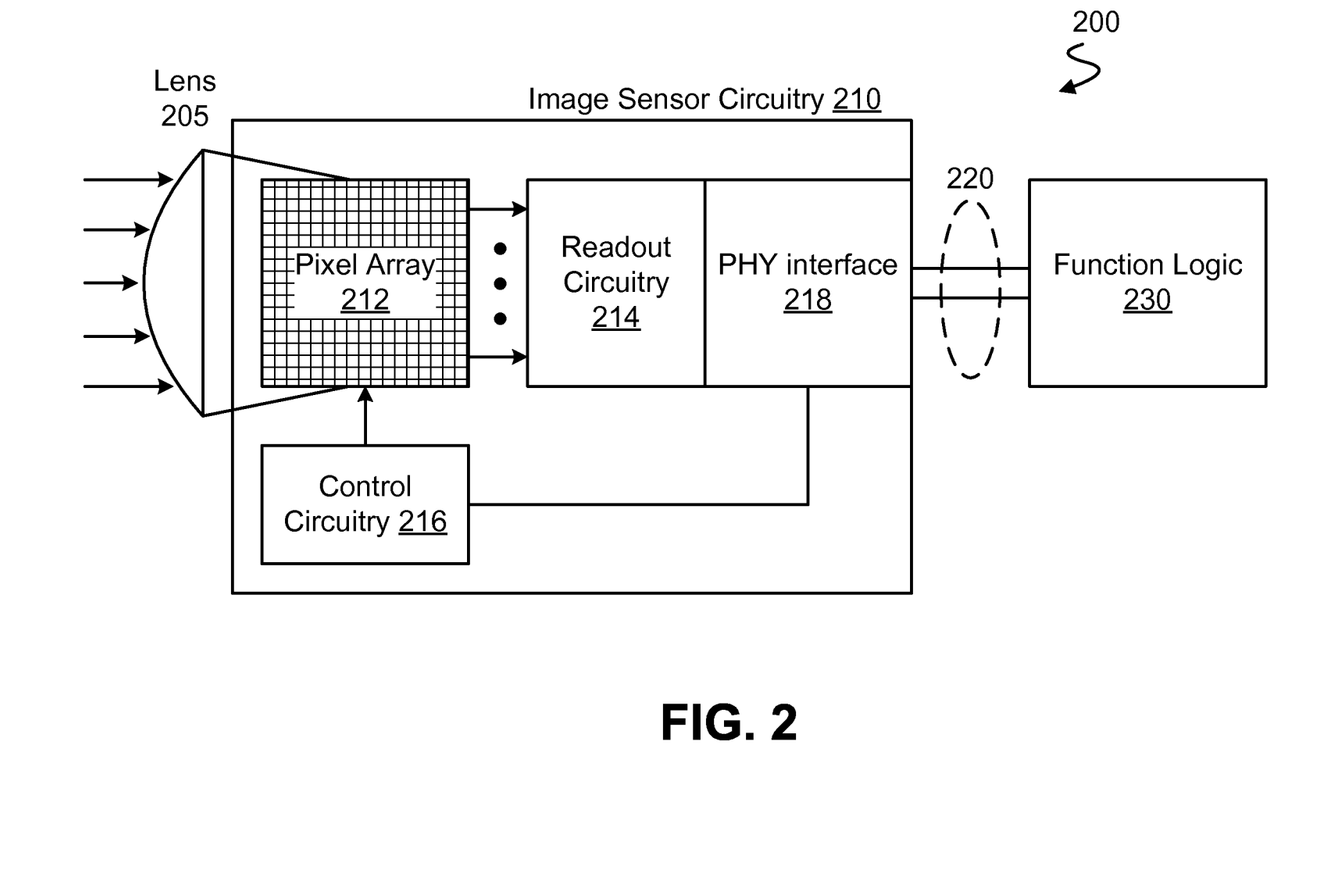
FIG. 2 is a block diagram illustrating select elements of a device for communicating data according to an embodiment.

FIG. 2 is a block diagram illustrating select elements of a device 200 for communicating data using a low common mode driver according to an embodiment. Device 200 may include a PHY interface 218—e.g. an interface for image sensor circuitry 210 of device 200—to variously operate in two different transmission modes for providing output 220. One such transmission mode may be a relatively lower power and lower speed mode, as compared to the other, relatively higher power and higher speed transmission mode.

Device 200 may, for example, include any of a variety of devices which having image sensing capability. By way of illustration and not limitation, device 200 may include a desktop computer, laptop computer, tablet or other handheld computer, mobile phone, dedicated digital (e.g. still and/or video) camera, and the like.

Although shown in the context of an illustrative device 200, it is understood that various embodiments may be implemented entirely within an interface having characteristics of PHY interface 218. Accordingly, it is also understood that certain features of device 200 which are external to PHY interface 218 may not be limiting on certain embodiments. For example, operation of PHY interface 218 may be extended to apply to an interface which, additionally or alternatively, communicates information other than image data. Furthermore, such an interface may, additionally or alternatively, provide an interface for circuitry which relays, rather than generates, image data.

Image sensor circuitry 210 may include a pixel array 212, readout circuitry 214 and control circuitry 216. Some or all of image sensor circuitry 210 may reside on an integrated circuit (IC) chip which communicates with one or more off-chip components via PHY interface 218. In an embodiment, pixel array 212 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

Pixel array 212 may be exposed to an image—e.g. via a lens 205 of device 200. After pixels of pixel array 212 have acquired their image data or image charge, the image data is readout by readout circuitry 214 and transferred directly or indirectly to function logic 230—e.g. a process running on a processor which is coupled directly or indirectly to PHY interface 218. Readout circuitry 214 may include amplification circuitry, analog-to-digital ("ADC") conversion circuitry, parallel-to-serial conversion circuitry, and/or otherwise. Function logic 230 may simply store the image data to a memory (not shown) or even manipulate the image data by applying post image effects (e.g., crop, rotate, remove red eye, adjust brightness, adjust contrast, or otherwise). In one embodiment, readout circuitry 214 may readout a row of image data at a time along readout column lines (illustrated) or may readout the image data using a variety of other techniques (not illustrated), such as a serial readout or a full parallel readout of all pixels simultaneously.

Control circuitry 216 is coupled to pixel array 212 to control operational characteristic of pixel array 212. For example, control circuitry 216 may generate a shutter signal for controlling image acquisition. In one embodiment, the shutter signal is a global shutter signal for simultaneously enabling all pixels within pixel array 212 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
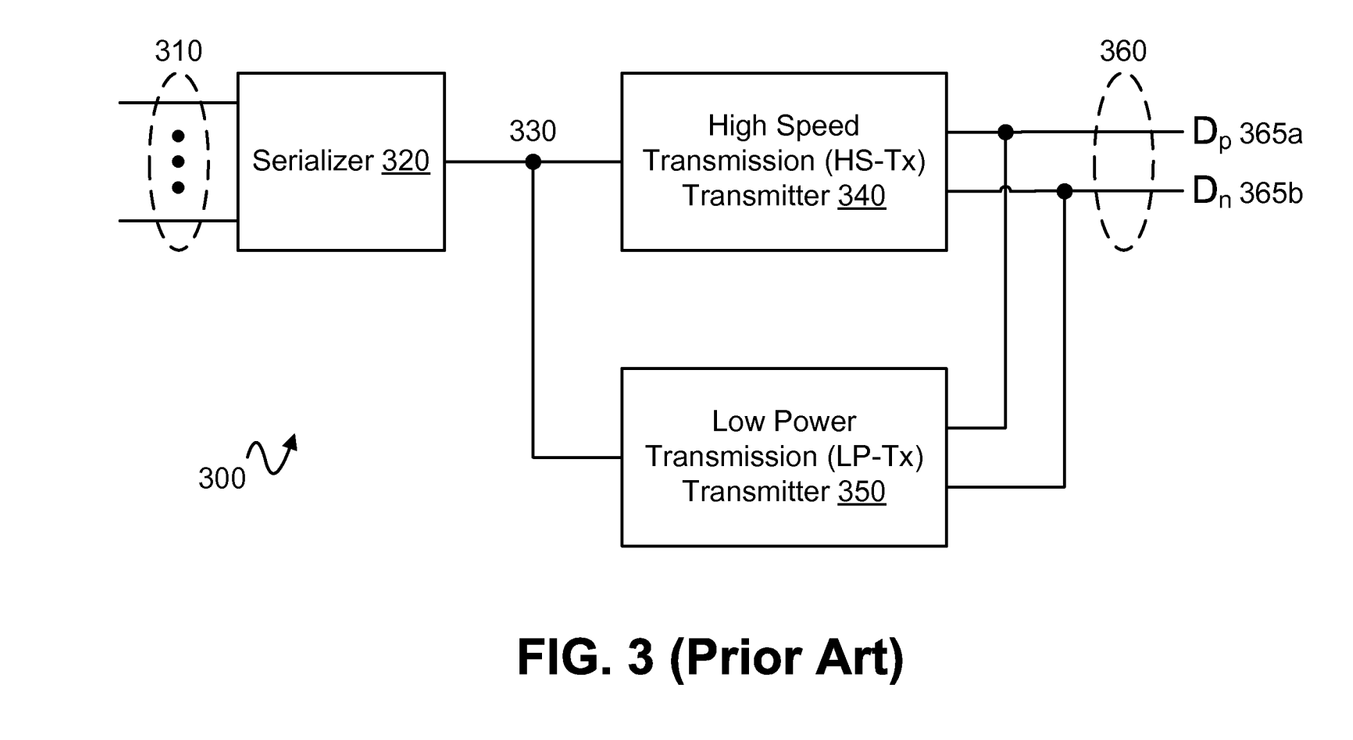
FIG. 3 is a block diagram of a conventional MIPI transmitter.

FIG. 3 is a block diagram of a conventional MIPI transmitter system 300. MIPI system 300 includes serializer 320, high speed transmission ("HS-TX") transmitter 340 and low power transmission ("LP-TX") transmitter 350. Serializer 320 (also referred to as a multiplexer, or "MUX") converts parallel data—e.g. received on multiple parallel channels 310—into a single data channel 330 having a higher rate of transmission. Readout circuitry 214 may, for example, include circuitry to implement the functionality of serializer 320.

As shown in FIG. 3, HS and LP transmissions can share the same physical lane to reduce the number of package pins and cost of packing. For example, a differential output 360 of MIPI transmitter system 300 includes respective output signals provided on output pads Dp 365a and Dn 365b. Transmitter functions (such as a "lane state") can be programmed by driving the lane with certain line levels. For example, a HS-TX transmitter 340 of MIPI transmitter system 300 drives the lane differentially with a low common mode voltage level of 200 mV and differential swing of 200 mV. By contrast, a LP-TX transmitter 350 of MIPI transmitter system 300 may, at other times, output signals which toggle between 0V and 1.2V.

HS-TX transmitter 340 and LP-TX transmitter 350 of conventional MIPI system 300 are separate functional elements. However, as demonstrated herein, a single set of circuitry may, according to certain embodiments, variously exhibit respective transmission characteristics of both HS-TX transmitter 340 and LP-TX transmitter 350.

Existing common mode driver designs include using current mode logic ("CML") drivers and using large capacitive or resistive loads. However, these types of drivers take up silicon space on the semiconductor chip and consume a lot of power. Various embodiments provide techniques for limiting such power penalties.

In an embodiment, a transmitter includes a pre-driver coupled to receive one or more data signals and to provide driver input voltages based on the one or more data signals. The transmitter may further include a driver coupled to provide a differential output based on the driver input voltages. The driver may include a set of circuit elements to provide an output signal of a differential output.

In certain embodiments, the transmitter includes one or more regulator circuits coupled to provide regulated power to the driver of the transmitter. A regulator circuit may include, for example, a scale replica circuit which includes a replica of the set of circuit elements of the driver. The scale replica circuit may be coupled to provide a feedback voltage for power supply regulation.

In one embodiment, the regulator circuit includes a transistor through which the driver is powered and an error amplifier—e.g. wherein an output of error amplifier controls operation of the transistor. The error amplifier may, for example, amplify a difference between a reference voltage and the feedback voltage provided by the scale replica circuit. In an embodiment, the scale replica circuit and the transistor share a connection to an output of the error amplifier.

Figure 4:
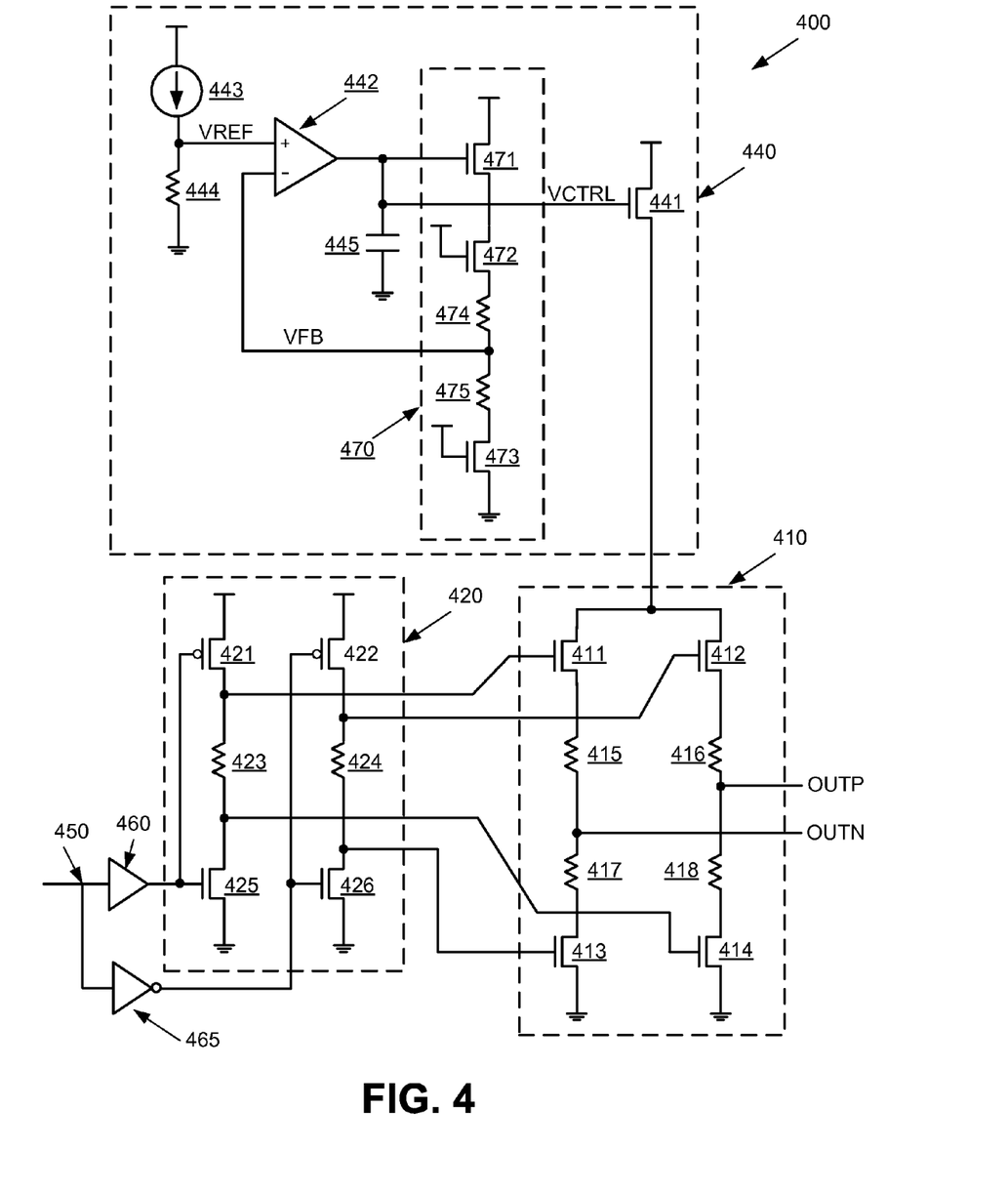
FIG. 4 is a block diagram illustrating select elements of a high speed differential transmitter with a regulated driver stage according to an embodiment.

By way of illustration and not limitation, FIG. 4 shows select elements of a high speed differential transmitter 400 with a regulated driver stage according to an embodiment. High speed differential transmitter 400 may comprise driver stage 410, pre-driver 420 and regulator circuit 440. Driver stage 410 may be an NMOS-over-NMOS (or "N-over-N") structure and may comprise a pull up path and a pull down path. By way of illustration and not limitation, a first pull up path may include a transistor 411 and resistor 415, and a second pull up path may include a transistor 412 and a resistor 416. Similarly, a first pull down path may include a transistor 413 and resistor 417, and a second pull down path may include a transistor 414 and a resistor 418. The first set of circuit elements of transmitter 400 may include, for example, some or all of the elements in the circuit branch including transistors 412, 414 and resistors 416, 418. Alternatively, the first set of circuit elements may include some or all of the elements in the circuit branch including transistors 411, 413 and resistors 415, 417. In other words, elements from either of these two circuit branches may be considered a first set of circuit elements for which a scale replica is included in replica circuit element 470. In an embodiment, elements from the other of these two circuit branches may be considered a second set of circuit elements for which a scale replica is included in replica circuit element 470.

Regulator circuit 440 may include a replica circuit 470 as part of means for regulating power for driver 410. Replica circuit 470 may include a replica (e.g. transistors 472, 473 and resistors 474, 475) of the first set of circuit elements. A replica of a set of circuit elements, as referred to herein, has at least the same configuration with respect to one another as that of some reference set of circuit elements. Moreover, one or more characteristics (e.g. resistance, capacitance, inductance, and/or the like) of circuit elements of the replica may be in a certain proportion to one another according to a corresponding proportion of such characteristics in the reference set of circuit elements.

The output impedance of a pull up path may be controlled by a replica bias in regulator circuit 440 via voltage control signal, VCTRL, generated by replica circuit 470. For example, a feedback loop may help control the output impedance of the pull path—e.g. a feedback loop for error amplifier 442 which includes some portion of replica circuit 470 and which is coupled to capacitor 445. In an embodiment, a voltage feedback VFB may be provided from a circuit node of replica circuit 470 which corresponds to a circuit node from which an output signal is to be provided. For example, the voltage feedback VFB may be provided from a node between resistors 474, 475, which correspond to one or either of the node between resistors 415, 417 and the node between resistors 416, 418.

However, the output impedance of pull down transistors 413 and 414 may not be controlled by output regulator 440, but may vary with changes in process, voltage and/or temperature (PVT). To reduce the variation of the output impedance of the pull down path to changes in PVT, resistor 417 may be coupled between differential output signal OUTN and pull down transistor 413, and resistor 418 coupled between differential output signal OUTP and pull down transistor 414. Changes in PVT have less effect on resistors than they do on NMOS transistors. The output impedance of the pull down path may, for example, be the sum of the resistances of resistor 417 and transistor 413 or, alternatively, the sum of the resistances of resistor 418 and transistor 414. The respective resistances of resistors 417 or 418 may each make up a major portion of the output impedance of the corresponding pull down path, which reduces the effect of PVT on the output impedance of these pull down paths. More particularly, resistor 418 may provide a majority of the pull-down output impedance Zd for output signal OUTP. Alternatively or in addition, resistor 417 may provide a majority of the pull-down output impedance (e.g. equal to Zd) for output signal OUTN. In one embodiment, the size of pull down transistor 413 and 414 is chosen so that the output impedance Zd of the pull-down path for OUTP when OUTP is at a logic low output, and the output impedance of the pull-down path for OUTN when OUTN is at a logic low output, are each approximately 50Ω Similarly, the sizes of NMOS transistor 441 and pull up transistors 411 and 412 may be chosen so that the output impedance of the pull up path for OUTP when OUTP is at a logic high output, and the output impedance of the pull-up path for OUTN when OUTN is at a logic high output, are each approximately 50 Ω.

Resistor 415 may be coupled between differential output OUTN and pull up transistor 411 to reduce the variation of the pull-up output impedance Zu—e.g. variation with PVT—measured at the circuit node which is to provide output signal OUTN. Similarly, resistor 416 may be coupled between differential output OUTP and pull up transistor 412 to reduce the variation of the pull-up output impedance (e.g. equal to Zu) measured at the circuit node which is to provide output signal OUTP. However, resistors 415 and 416 may not make up a major portion of the pull-up output impedance, since such output impedance is to be controlled by voltage control signal VCTRL, generated by replica circuit 470. In one embodiment resistors 415, 416, 417 and 418 are poly resistors, in other embodiments resistors 415, 416, 417 and 418 may be other types of resistors. In another embodiment, resistors 415, 416 and the corresponding scale replica resistor 474 may be omitted.

One disadvantage of output stage 410 may be that pull up transistors 411 and 412 suffer body effect where the source terminal of one of pull up transistors 411 and 412 is at a higher potential than the corresponding bulk terminal. As a result, the threshold voltage of pull up transistors 411 and 412 may be greater than the threshold voltage of pull down transistors 413 and 414. For example, if the same signal were to be applied to the gate terminal of pull up transistors 411 and 412 and pull down transistors 413 and 414, pull up transistors 411 and 412 will turn on slower and turn off faster than pull down transistors 413 and 414. Since this may cause an imbalance and the asymmetric rising and falling edge of differential output OUTP and OUTN, the addition of resistors 423 and 424 may correct the imbalance.

The gate terminals of pull up transistors 411 and 412 may be coupled, respectively, to a first terminus (or "port") of resistor 423 and a first port of resistor 424. The gate terminals of pull down transistors 414 and 413 may be coupled, respectively, to a second port of resistor 423 and a second port of resistor of resistor 424. The added resistance slows down the turning off of pull up transistor 411 and 412 and the turning on of pull down transistors 413 and 414. This will reduce the asymmetric rising and falling edge of differential output OUTP and OUTN.

Pre-driver 420 may comprise pull up PMOS transistors 421 and 422, where transistor 421 is coupled between VDD and the first port of resistor 423, and transistor 422 is coupled between VDD and the first port of resistor 424. The second ports of resistors 423 and 424 may be coupled, respectively, to pull down NMOS transistors 425 and 426. The gates of pull up PMOS transistor 421 and pull down NMOS transistor 425 may be coupled to a buffered version of data signal 450 via buffer 460, and the gates of pull up PMOS transistor 422 and pull down NMOS transistor 426 may be coupled to an inverted version of data signal 450 via inverter 465.

Regulator circuit 440 may provide power to driver stage 410 and may comprise replica circuit 470 and error amplifier 442. Along with capacitor 445, error amplifer 442 and replica circuit 470 make up a feedback loop to regulate power to driver stage 410. Replica circuit 470 may comprise NMOS transistor 471, 472 and 473 and resistors 474 and 475, as seen in FIG. 4. The output of error amplifier 442, VCTRL may be coupled to the gate of NMOS transistor 441 and its scale replica, NMOS transistor 471. The non-inverting input of error amplifier may be coupled to current source 443 and resistor 444. Capacitor 445 provides compensation capacitance to keep the feedback loop stable. Together, current source 443 and resistor 444 generate voltage reference, VREF. In one embodiment, VREF may be set at 0.3V, the logic high voltage of a transmitter in high speed mode.

Scale replica 470 may be sized to produce a current that is some desired fraction of the current consumed by driver stage 410. An illustrative case of a one-fourth scale factor is discussed herein. However, it is understood that certain embodiments may include any of a variety of additional or alternative scale factors for a replica circuit.

In an embodiment, the width of transistors 472, 473 in replica circuit 470 may be one-fourth that of their counterpart transistors 412, 414 (and/or transistors 411, 413) in driver stage 410. Pull up transistors 411 and 412 each may be four times the size of NMOS transistors 472 and pull down transistors 413 and 414 each may be four times the size of NMOS transistor 473. Similarly, NMOS transistor 441 may be four times the size of NMOS transistors 471. The resistance of resistors 415 and 416 each may be one-fourth the resistance of resistor 474. The resistance of resistor 417 (or resistor 418) and the resistance of the resistor load at the receiver side may be one-fourth the resistance of resistor 475.

The output impedance Zru of pull up path of scale replica 470—measured at the voltage feedback VFB—may be four times the value of Zu. Similarly, the output impedance Zrd of pull down path of scale replica 470—measured at the voltage feedback VFB—may be four times the value of the sum of Zd and an off-chip termination resistor. In one embodiment, the size of NMOS transistors 471, 472 and 473 and resistors 474 and 475 are chosen so that when the feedback voltage, VFB may be 0.3V, Zrd may be approximately 600Ω, Zd may be approximately 50Ω, assuming there is 100Ω off chip termination resistor, Zru may be approximately 200 Ω and Zu may be approximately 50Ω.

In certain embodiments, a regulator circuit is coupled to provide regulated power to the pre-driver—e.g. where the pre-driver includes a transistor coupled to a supply voltage and through which power from the supply voltage is provided to the pre-driver. The regulator circuit may include a first amplifier and an error amplifier—e.g. where an output of the error amplifier drives the gate of the transistor and the first amplifier drives the body of the transistor. The regulator circuit may include a scale replica circuit including a replica of a set of circuits of the driver, where the set of circuits are coupled to provide an output signal of a differential output. The replica circuit of the regulator circuit may be coupled to provide a feedback voltage to the error amplifier—e.g. wherein the error amplifier is to amplify a difference between the feedback voltage and a reference voltage. The scale replica circuit may be further coupled to a feedback loop extending from the transistor back to the first amplifier.

Figure 5:
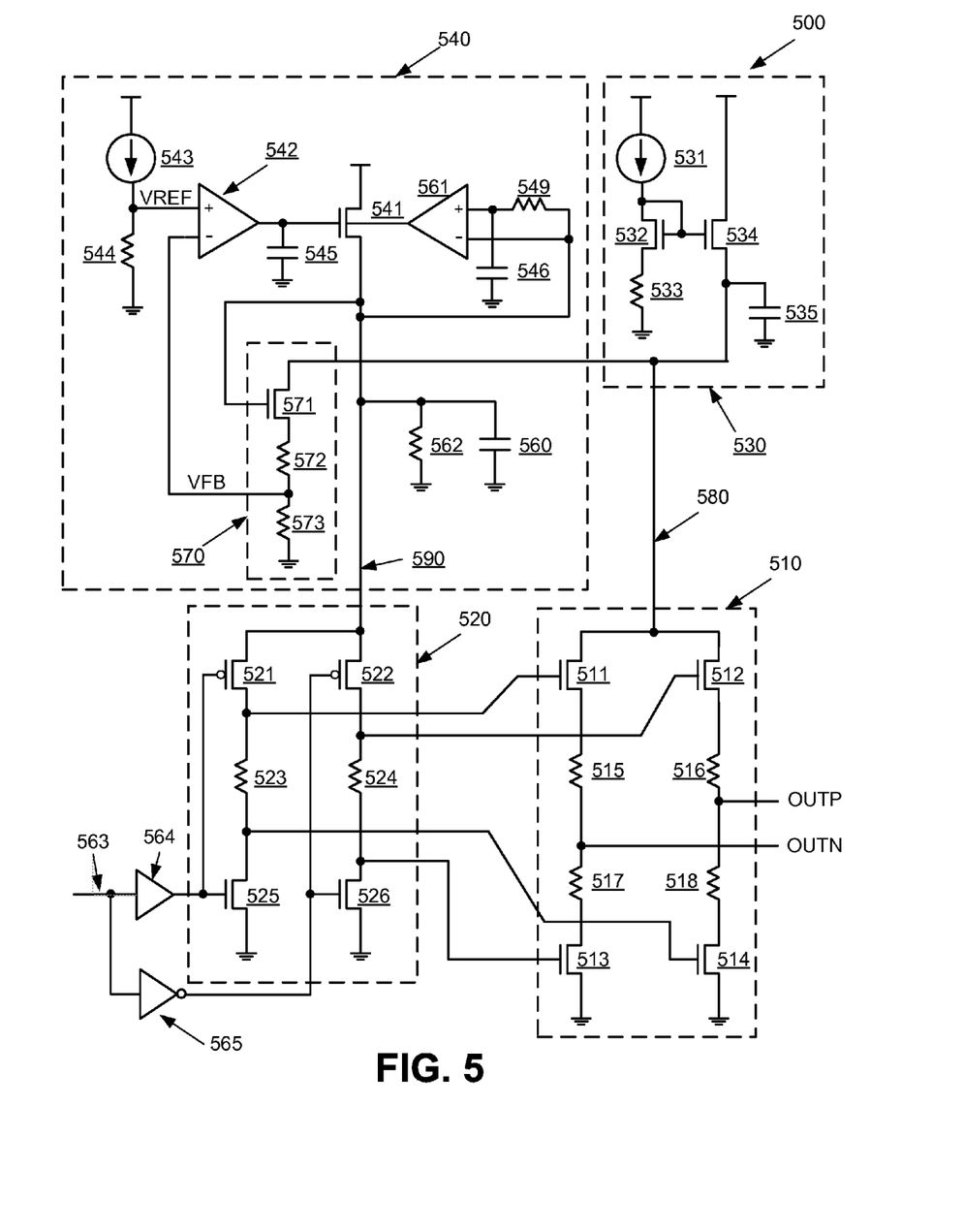
FIG. 5 is a block diagram illustrating select elements of a high speed differential transmitter with a pre-driver regulator and output stage open-loop regulator according to an embodiment.

FIG. 5 shows select elements of a high speed differential transmitter 500 with a pre-driver regulator and output stage open-loop regulator according to an embodiment. By way of illustration and not limitation, high speed differential transmitter 500 may comprise output stage 510, pre-driver 520, output stage open-loop output regulator 530 and pre-driver regulator 540.

Open-loop output regulator 530 may comprise current source 531, NMOS transistors 532 and 534 and resistor 533, where NMOS transistors 532 and 534 form a current mirror. Current source 531 may be coupled between VDD and a first port of NMOS transistor 532. Resistor 533 may be coupled between a second port of NMOS transistor 532 and ground. A first port of NMOS transistor 534 may be coupled to VDD, where the second port of NMOS transistor 534 outputs regulator voltage 580. Capacitor 535 may be coupled between regulator voltage 580 and ground—e.g. to provide decoupling capacitance to reduce regulator voltage noise.

Pre-driver 520 may comprise pull up PMOS transistors 521 and 522 coupled, respectively, to a first port of resistor 523 and a first port of resistor 524. The second ports of resistors 523 and 524 may be coupled, respectively, to pull down NMOS transistors 525 and 526. The gates of pull up PMOS transistor 521 and pull down NMOS transistor 525 may be coupled to a buffered version of data signal 563 via buffer 564, and the gates of pull up PMOS transistor 522 and pull down NMOS transistor 526 may be coupled to an inverted version of data signal 563 via inverter 565.

The power provided to pull up transistors 511 and 512 of output stage 510 may be controlled by open-loop output regulator 530. Alternatively or in addition, the power provided to pull up transistors 521 and 522 of pre-driver 520 may be controlled by pre-driver regulator 540. Regulator voltage 580 may be determined by current source 531, NMOS transistors 532, 534 and resistor 533. Open-loop regulators take up less silicon area and consume less power than a closed-loop regulator. In one embodiment, regulator voltage 580 may be set at around 0.4V.

A disadvantage of open-loop regulators is its variance of regulator voltage 580 with changes in PVT, however replica circuit 570 in pre-driver regulator 540 may track changes in PVT. Replica circuit 570 may, for example, comprise a replica of a set of circuits in driver 510 which are coupled to provide an output signal of the differential output. By way of illustration and not limitation, NMOS transistor 571 and resistors 572, 573 of replica circuit 570 may be a replica of transistor 511 and resistors 515, 517, and/or a replica of transistor 512 and resistors 516, 518. A first port of NMOS transistor 571 may be coupled to regulator voltage 580, a second port of NMOS transistor 571 may be coupled to a first port of resistor 572. Resistor 573 may be coupled between the second port of resistor 572 and ground. The second port of resistor 572 may be coupled to the inverting input of error amplifier 542. In the illustrated embodiment, replica circuit 570 is not a replica of all circuit elements in either branch of driver 510. However, in one embodiment, an additional NMOS transistor may, for example, be coupled between resistor 573 and ground, with the gate of this additional NMOS transistor coupled to regulator voltage 590.

Resistor pair 515, 516 (or resistor pair 517, 518)—corresponding to replica resistor pair 572, 573—may reduce the variation of the output impedance of output stage 510 to changes in PVT. In one embodiment, resistors 515, 516 and their corresponding scale replica resistor 572 may be omitted. As discussed with regard to resistors 423 and 424, resistors 523 and 524 may correct the asymmetric rising and falling edge of differential output OUTP and OUTN caused by output stage 510.

Pre-driver regulator 540 provides regulator voltage 590 to pre-driver 520. Regulator voltage 590 may be controlled by a feedback loop which includes error amplifier 542, transistor 541 and elements of replica circuit 570. Replica circuit 570 and output stage 510 have the same power supply, regulated voltage 580. The feedback loop will produced a feedback voltage VFB from replica circuit 570 for amplifier 542 to subtract from reference voltage VREF. In one embodiment, VREF may equal the logic high voltage for high speed mode—e.g. 0.3V—and the width of transistors in replica circuit 570 may be some fraction (e.g. one-fourth) of its counterparts in output stage 510.

A high gain may be required for error amplifier 542 to achieve good accuracy in replica circuit 570. However, the output impedance of error amplifier 542 may also be high, which, as a result, may cause feedback loop response of VFB to be slow. When loading condition changes, regulator voltage 590 may drift away from a target value, and cause regulator voltage noise before the slow feedback loop pulls regulator voltage 590 back. Regulator voltage noise may thus show up at the differential output OUTP and OUTN as common mode noise. In order to reduce the occurrence of common mode noise, a second feedback loop may be added. This second feedback loop may comprise amplifier 561, resistor 549 and capacitor 546. The gain of amplifier 561 may be low to result in a faster feedback loop. Resistors 549 and capacitor 546 may form a low pass filter to filter out the regulator voltage drift and may be coupled to the non-inverting input of amplifier 561. The inverting input of amplifier 561 may be coupled to regulator voltage 590. When regulator voltage 590 drifts away from the target value, amplifier 561 drives the back gate or body of transistor 541 to correct the drift before the slow feedback loop responds.

Resistor 562 may, in an embodiment, be coupled between regulator voltage 590 and ground to limit regulator voltage 590 from floating when data signal 563 is not toggling. Capacitor 560 may be coupled to regulator voltage 590 as a de-coupling capacitor to reduce high frequency noise in regulator voltage 590.

As shown above, a transmitter may comprise, in certain embodiments, another regulator circuit to provide regulated power to the driver of the transmitter—e.g. where the other regulator circuit is coupled to the regulator circuit regulating power to the pre-driver. In an alternate embodiment, a single regulator circuit may provide regulated power to both the pre-drive and the driver of the transmitter.

Figure 6:
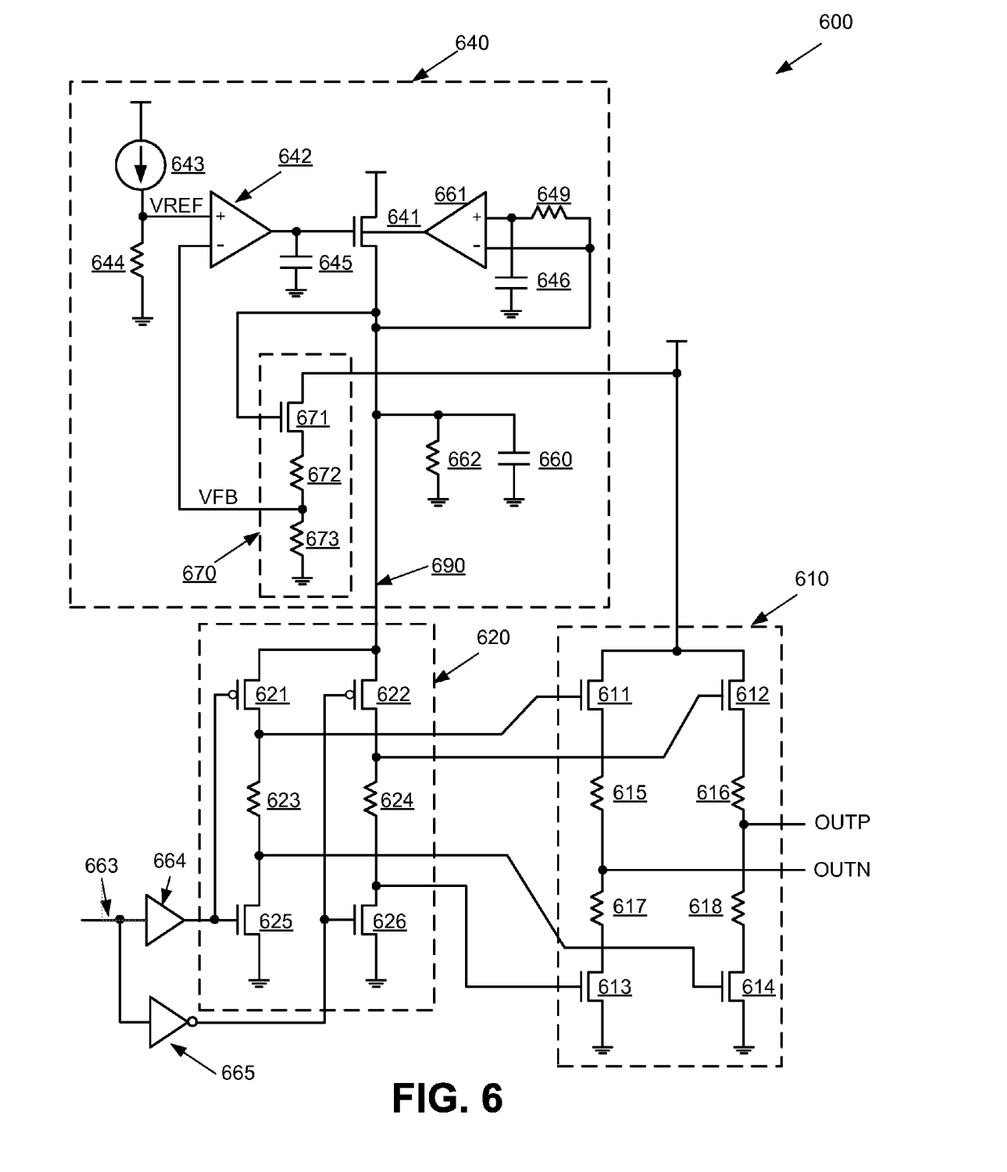
FIG. 6 is a block diagram illustrating select elements of a high speed differential transmitter with a pre-driver regulator according to an embodiment.

FIG. 6 shows select elements of a high speed differential transmitter 600, with a pre-driver regulator according to an embodiment. High speed differential transmitter 600 may be similar to the high speed differential transmitter in FIG. 5, but where the open-loop output regulator 530 is omitted, output stage 510 and replica circuit 570 are directly connected to VDD. By omitting the open-loop output regulator the area taken up by high speed differential transmitter circuit can be reduced, without having a great impact on the performance of the transmitter.

By way of illustration and not limitation, high speed differential transmitter 600 may comprise output stage 610, pre-driver 620, and regulator circuit 640. Pre-driver 620 may comprise pull up PMOS transistors 621 and 622 coupled, respectively, to a first port of resistor 623 and a first port of resistor 624. The second ports of resistors 623 and 624 may be coupled, respectively, to pull down NMOS transistors 625 and 626. The gates of pull up PMOS transistor 621 and pull down NMOS transistor 625 may be coupled to a buffered version of data signal 663 via buffer 664, and the gates of pull up PMOS transistor 622 and pull down NMOS transistor 626 may be coupled to an inverted version of data signal 663 via inverter 665.

Pull up transistors 611 and 612 of output stage 610 may be directly coupled to VDD. The power provided to pull up transistors 621 and 622 of pre-driver 620 may be controlled by regulator 640, which includes a replica circuit 670. Replica circuit 670 may, for example, comprise a replica of a set of circuits in driver 610 which are coupled to provide an output signal of the differential output. By way of illustration and not limitation, NMOS transistor 671 and resistors 672, 673 of replica circuit 670 may be a replica of transistor 611 and resistors 615, 617, and/or a replica of transistor 612 and resistors 616, 618. A first port of NMOS transistor 671 may be coupled directly to VDD, and a second port of NMOS transistor 671 may be coupled to a first port of resistor 672. Resistor 673 may be coupled between the second port of resistor 672 and ground. The second port of resistor 672 may be coupled to the inverting input of error amplifier 642. In the illustrated embodiment, replica circuit 670 is not a replica of all circuit elements in either branch of driver 610. However, in one embodiment, an additional NMOS transistor may, for example, be coupled between resistor 673 and ground, with the gate of this additional NMOS transistor coupled to regulator voltage 690.

Resistor pair 615, 616 (or resistor pair 617, 618)—corresponding to replica resistor pair 672, 673—may reduce the variation of the output impedance of output stage 610 to changes in PVT. In one embodiment, resistors 615, 616 and their corresponding scale replica resistor 672 may be omitted. As discussed with regard to resistors 423 and 424, resistors 623 and 624 may correct the asymmetric rising and falling edge of differential output OUTP and OUTN caused by output stage 610.

Pre-driver regulator 640 provides regulator voltage 690 to pre-driver 620. Regulator voltage 690 may be controlled by a feedback loop which includes error amplifier 642, transistor 641 and elements of replica circuit 670. Replica circuit 670 and output stage 610 have the same power supply, VDD. The feedback loop will produced a feedback voltage VFB from replica circuit 670 for amplifier 642 to subtract from reference voltage VREF. In one embodiment, VREF may equal the logic high voltage for high speed mode—e.g. 0.3V—and the width of transistors in replica circuit 670 may be some fraction (e.g. one-fourth) of its counterparts in output stage 610.

A high gain may be required for error amplifier 642 to achieve good accuracy in replica circuit 670. However, the output impedance of error amplifier 642 may also be high, which, as a result, may cause feedback loop response of VFB to be slow. When loading condition changes, regulator voltage 690 may drift away from a target value, and cause regulator voltage noise before the slow feedback loop pulls regulator voltage 690 back. Regulator voltage noise may thus show up at the differential output OUTP and OUTN as common mode noise. In order to reduce the occurrence of common mode noise, a second feedback loop may be added. This second feedback loop may comprise amplifier 661, resistor 649 and capacitor 646. The gain of amplifier 661 may be low to result in a faster feedback loop. Resistors 649 and capacitor 646 may form a low pass filter to filter out the regulator voltage drift and may be coupled to the non-inverting input of amplifier 661. The inverting input of amplifier 661 may be coupled to regulator voltage 690. When regulator voltage 690 drifts away from the target value, amplifier 661 drives the back gate or body of transistor 641 to correct the drift before the slow feedback loop responds.

Resistor 662 may, in an embodiment, be coupled between regulator voltage 690 and ground to limit regulator voltage 690 from floating when data signal 663 is not toggling. Capacitor 660 may be coupled to regulator voltage 690 as a de-coupling capacitor to reduce high frequency noise in regulator voltage 690.

Techniques and architectures for providing high-speed transmissions and low power transmissions are described herein. In the above description, for purposes of explanation, numerous specific details are set forth to provide a thorough understanding of certain embodiments. One skilled in the relevant art will recognize, however, that the techniques described herein can be practiced without one or more of the specific details, or with other methods, components, materials, etc. In some instances, well-known structures, materials, or operations are not shown or described in detail to avoid obscuring certain aspects of various embodiments.

Reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A transmitter comprising:
    a pre-driver coupled to receive a data signal and to output driver input voltages based on the data signal;
    a driver coupled to the pre-driver, the driver including a first set of circuit elements coupled in series with one another, wherein the first set of circuit elements are coupled to provide a first output signal of a differential output based on the driver input voltages; and
    a first regulator circuit coupled to provide regulated power to the driver, the first regulator circuit including:
        a first transistor coupled between the driver and a supply voltage rail;
        a scale replica circuit having a replica of the first set of circuit elements; and
        an error amplifier, wherein the scale replica circuit and the first transistor are both coupled to an output of the error amplifier, wherein the scale replica circuit is coupled to provide a feedback voltage to the error amplifier, wherein the error amplifier is coupled to amplify a difference between the feedback voltage and a reference voltage.

2. The transmitter of claim 1, the first set of circuit elements having:
    a second transistor coupled to the first output signal;
    a first resistor coupled between the second transistor and the first output signal; and
    a third transistor coupled to the first output signal.

3. The transmitter of claim 2, wherein a second resistor is coupled between the third transistor and the first output signal.

4. The transmitter of claim 1, wherein the driver includes a second set of circuit elements coupled in series with one another, the second set of circuit elements coupled to provide a second output signal of the differential output, wherein the second set of circuit elements are coupled in parallel with the first set of circuit elements.

5. The transmitter of claim 1, wherein the scale replica circuit is one-fourth scale replica of the first set of circuit elements.

6. The transmitter of claim 1, wherein a gate of the first transistor and a gate of a transistor of the scale replica circuit are coupled to the output of the error amplifier.

7. An imaging device comprising:
    a pixel array;

readout circuitry to generate image data based on signals from the pixel array; and a transmitter coupled to the readout circuitry to transmit the image data, the transmitter comprising:
- a pre-driver coupled to receive a data signal and to output driver input voltages based on the data signal;
- a driver coupled to the pre-driver, the driver including a first set of circuit elements coupled in series with one another, wherein the first set of circuit elements coupled to provide a first output signal of a differential output based on the driver input voltages; and
- a first regulator circuit coupled to provide regulated power to the driver, the first regulator circuit including:
  - a first transistor coupled between the driver and a supply voltage rail;
  - a scale replica circuit having a replica of the first set of circuit elements; and
  - an error amplifier, wherein the scale replica circuit and the first transistor are both coupled to an output of the error amplifier, wherein the scale replica circuit is coupled to provide a feedback voltage to the error amplifier, wherein the error amplifier is coupled to amplify a difference between the feedback voltage and a reference voltage.

8. The imaging device of claim 7, the first set of circuit elements having:
- a second transistor;
- a first resistor coupled between the second transistor and the first output signal; and
- a third transistor coupled to the first output signal.

9. The imaging device of claim 8, wherein a second resistor is coupled between the first output signal and the third transistor.

10. The imaging device of claim 8, wherein the driver includes a second set of circuit elements coupled in series with one another, the second set of circuit elements coupled to provide a second output signal of the differential output, wherein the second set of circuit elements are coupled in parallel with the first set of circuit elements.

11. The imaging device of claim 7, wherein a gate of the first transistor and a gate of a transistor of the scale replica circuit are coupled to the output of the error amplifier.

12. A transmitter comprising:
- a pre-driver coupled to receive a data signal and to provide driver input voltages based on the data signal;
- a driver coupled to the pre-driver, the driver including a first set of circuit elements coupled in series with one another, wherein the first set of circuit elements are coupled to provide a first output signal of a differential output based on the driver input voltages;
- a first regulator circuit coupled to provide regulated power to the pre-driver, the first regulator circuit including:
  - a first transistor, wherein the pre-driver is coupled to a supply voltage via the first transistor;
  - a scale replica circuit having a replica of the first set of circuit elements;
  - an error amplifier; and
  - a first amplifier, wherein an output of the error amplifier and an output of the first amplifier are both connected to the first transistor, wherein the scale replica circuit is coupled to provide a feedback voltage to the error amplifier, wherein the error amplifier to amplify a difference between the feedback voltage and a reference voltage, and wherein the scale replica circuit is further coupled to a feedback loop extending from the transistor back to the first amplifier.

13. The transmitter of claim 12, wherein the first set of circuit elements includes:
- a second transistor;
- a first resistor coupled between the second transistor and the first output signal; and
- a third transistor coupled to the first output signal.

14. The transmitter of claim 13, wherein the replica of the first set of circuit elements includes a fourth transistor corresponding to the third transistor, and wherein the replica circuit is coupled to the feedback loop via the fourth transistor.

15. The transmitter of claim 14, further comprising a second regulator circuit coupled to the first regulator circuit via the fourth transistor, the second regulator circuit coupled to provide regulated power to the driver.

16. The transmitter of claim 14, wherein the fourth transistor further coupled to conduct current directly from the supply voltage according to a voltage of the feedback loop.

17. The transmitter of claim 13, wherein a second resistor is coupled between the third transistor and the first output signal.

18. The transmitter of claim 12, wherein the first amplifier is coupled to provide an output representing a difference between a reference voltage and the feedback voltage.

* * * * *